(12) United States Patent
Su et al.

(10) Patent No.: US 9,508,617 B2
(45) Date of Patent: Nov. 29, 2016

(54) TEST CHIP, TEST BOARD AND RELIABILITY TESTING METHOD

(75) Inventors: Shiang-Ruei Su, Zhudong Township (TW); Liang-Chen Lin, Baoshan Shiang (TW); Chia-Wei Tu, Chubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 594 days.

(21) Appl. No.: 13/411,193

(22) Filed: Mar. 2, 2012

(65) Prior Publication Data

US 2013/0229190 A1 Sep. 5, 2013

(51) Int. Cl.
*H01L 21/66* (2006.01)
*G01R 31/28* (2006.01)

(52) U.S. Cl.
CPC .......... *H01L 22/34* (2013.01); *G01R 31/2856* (2013.01); *H01L 2924/0002* (2013.01)

(58) Field of Classification Search
CPC .................. G01R 31/2863; G01R 31/2889
USPC ........... 324/537–763.02; 257/48; 438/14–18; 428/14–18
See application file for complete search history.

(56) References Cited

U.S. PATENT DOCUMENTS

| 3,755,888 | A  | * | 9/1973  | Geil ................................ 29/593 |
| 5,285,152 | A  | * | 2/1994  | Hunter ................. G01R 31/046 324/73.1 |
| 5,517,036 | A  | * | 5/1996  | Semba ...................... G01R 1/06 257/207 |
| 5,822,191 | A  | * | 10/1998 | Tagusa et al. ................ 361/751 |
| 6,548,907 | B1 | * | 4/2003  | Yamada et al. ............... 257/773 |
| 2004/0217487 | A1 | * | 11/2004 | Low et al. .................... 257/780 |
| 2004/0256731 | A1 | * | 12/2004 | Mao ........................ C08L 65/00 257/773 |
| 2005/0127529 | A1 | * | 6/2005  | Huang et al. ................. 257/779 |
| 2006/0181299 | A1 | * | 8/2006  | Hirae ............................ 324/765 |
| 2008/0135840 | A1 | * | 6/2008  | Peng et al. ...................... 257/48 |
| 2008/0191205 | A1 | * | 8/2008  | Tsai et al. ....................... 257/48 |
| 2009/0011539 | A1 | * | 1/2009  | Jeng et al. ..................... 438/107 |
| 2010/0117080 | A1 | * | 5/2010  | Chen et al. ..................... 257/48 |

* cited by examiner

*Primary Examiner* — Melissa Koval
*Assistant Examiner* — Courtney McDonnough
(74) *Attorney, Agent, or Firm* — Hauptman Ham, LLP

(57) ABSTRACT

A test board includes a first chip mounting area, a first input area, a second input area, a first output area, and a second output area. The test board also includes a first conductive pattern, a second conductive pattern, a third conductive pattern, and a fourth conductive pattern. The first conductive pattern electrically connects a first pin of the first input area and a first pin of the first chip mounting area. The second conductive pattern electrically connects a first pin of the second input area and a second pin of the first chip mounting area. The third conductive pattern electrically connects a first pin of the first output area and a third pin of the first chip mounting area. The fourth conductive pattern electrically connects a first pin of the second output area and a fourth pin of the first chip mounting area.

20 Claims, 8 Drawing Sheets

TEST CHIP, TEST BOARD AND RELIABILITY TESTING METHOD

BACKGROUND

Portable or handheld electronic devices, e.g., calculators, cameras, cell phones, other mobile devices, etc., are prone to fail due to impacts as a result of dropping. Several testes have been developed to check the reliability of integrated circuits (ICs) or chips for portable or handheld electronic devices under simulated dropping conditions.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

DETAILED DESCRIPTION

Figure 1:
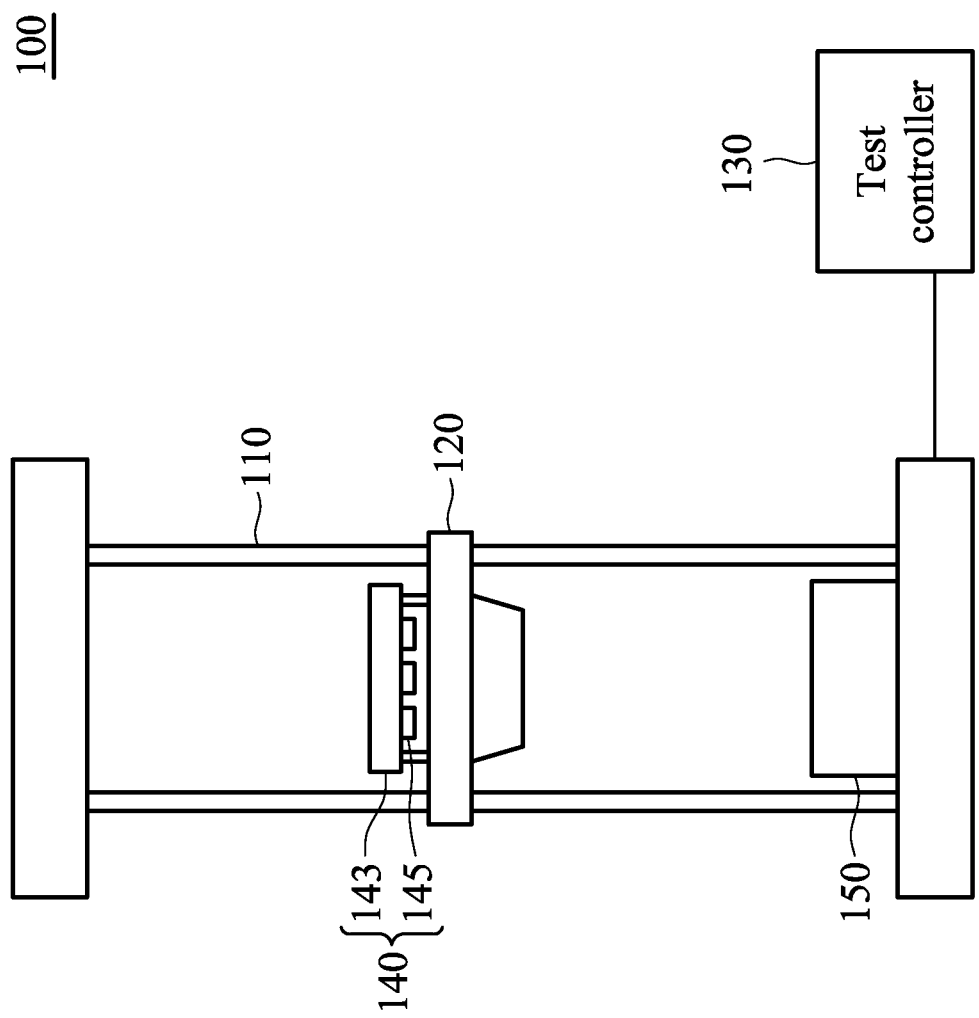
FIG. 1 is a schematic diagram of a drop reliability testing system in accordance with some embodiments.

It is to be understood that the following disclosure provides many different embodiments or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a schematic diagram of a drop reliability testing system 100, in accordance with some embodiments. The testing system 100 includes a frame 110, a drop table 120 and a test controller 130. A test specimen 140 is mounted on the drop table 120. For example, the test specimen 140 includes a board, e.g., a printed circuit board (PCB), 143 on which one or more chips 145 are mounted. In a drop test, the drop table 120 is raised to a predetermined height along the frame 110 and is then dropped, e.g., permitted to free fall under gravity, until the drop table 120 hits a stopping element 150 at the bottom of the frame 110. The test controller 130 is electrically connected to various sensing devices arranged on the frame 110 and/or the drop table 120 to measure and report an acceleration/deceleration profile of the drop test, such as peak and duration of acceleration/deceleration of the drop table, as well as variations of electrical parameters of the test specimen 140 before, during and/or after the drop test.

A standard for performing drop tests is Joint Electron Devices Engineering Council (JEDEC) STANDARD (JESD22-B111 & JESD22-B110A). Under JEDEC standards, the peak deceleration of the drop table is between 2900 G & 100 G, the deceleration duration is between 0.3-2 milliseconds (ms), and the deceleration profile is a half sine. During the drop test, data regarding change in resistance of the test specimen 140, especially the chips 145, is acquired by an in-situ event detector which is soldered to the test specimen 140. A failure is reported if the event detector indicates that the resistance exceeds 1000 Ohm for a predetermined period, e.g., from 0.1 to 1 microseconds ($\mu$s).

Recently, ICs for portable or handheld electronic devices, e.g., calculators, cameras, cell phones, personal digital assistants (PDAs), tablet/notebook/laptop computers, electronic reading devices, navigation devices, etc. become smaller and lighter, yet packed with more functionality. This tendency is met by, among other things, using low-k dielectric materials having dielectric constants (k) between 2.5 and 3.0 and extra low-k (ELK) dielectric materials having dielectric constants below 2.5 in metallization layers of such ICs. Such low-k or ELK materials improve the electrical performance of the metallization layers and, hence, increase the overall performance of the chip. However, low-k or ELK materials are more fragile than other dielectric materials and tend to crack or delaminate under stress and/or strain. To ensure reliability of ICs with low-k or ELK materials, the reliability of both the top level of interconnection (e.g., solder bumps, contact pads, conductive redistribution layers) and the lower level of interconnection, i.e., in metallization layers, is checked.

Figure 2:
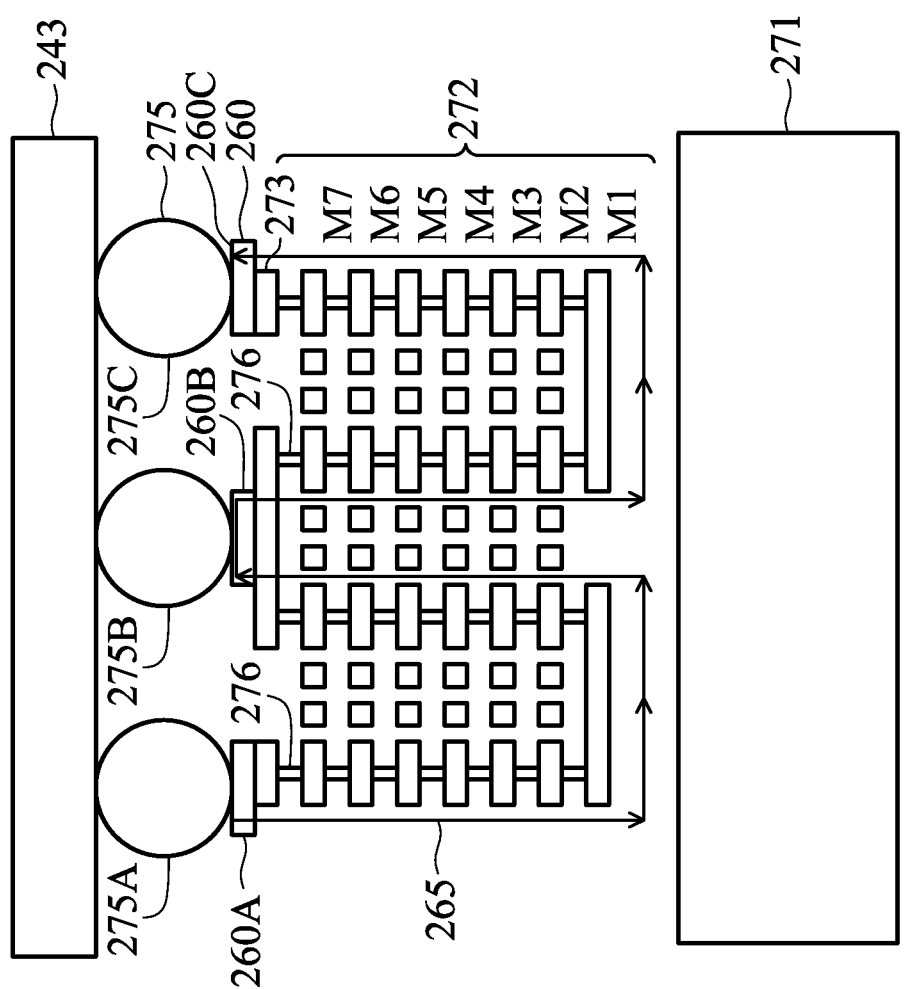
FIG. 2 is a schematic cross-section view of a test chip in accordance with some embodiments.

FIG. 2 is a schematic cross-section view of a test chip 200 in accordance with some embodiments. In some embodiments, the test chip 200 is mounted on a PCB and tested for reliability, similar to the testing of chips 145 described with respect to FIG. 1. The test chip 200 includes a silicon device (hereinafter "Si device") 271, a plurality of metallization layers 272 formed over the Si device 271, a conductive redistribution layer 273 formed over the metallization layers 272, and contact pads 260 formed over the conductive redistribution layer 273. The contact pads 260 are physically bonded to a PCB 243 by way of solder bumps 275. The PCB 243 and one or more test chips 200 thereon together define a test board. In some embodiments, the conductive redistribution layer 273 is replaced by a conductive substrate which has a first side connected to the metallization layers 272, and a second, opposite side connected to the contact pads 260. In one or more embodiments, the conductive substrate is a laminate substrate. In the description herein below, embodiments in which element 273 is a conductive redistribution layer are described in details. A similar description is applicable to embodiments in which element 273 is a conductive substrate.

The Si device 271 is a semiconductor device which includes, but is not limited to, bulk silicon, a semiconductor wafer, a silicon-on-insulator (SOI), a wafer-on-package a package-on-package, etc. Other semiconductor materials including group III, group IV, and group V elements are used in some embodiments.

In some embodiments, the Si device 271 includes no active devices formed therein or thereon. Examples of "active devices" include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.). Further examples of "active devices" include integrated circuits, such as logic devices, memory devices, RF devices, etc.

The metallization layers 272 include multiple dielectric and conductive layers arranged in an alternating manner. In FIG. 2, the conductive layers of the metallization layers 272 are indicated as M1, M2, M3, M4, M5, M6 and M7. The dielectric layers of the metallization layers 272 are each disposed between two adjacent conductive layers M1, M2, M3, M4, M5, M6 and M7. The dielectric layers are not indicated in FIG. 2 for simplicity. In some embodiments, the metallization layers 272 include other than seven conductive layers. In a fully functional chip, the metallization layers are arranged to connect various active devices formed in/on the Si device 271 with each other and with external circuitry via the conductive redistribution layer 273, the contact pads 260 and the solder bumps. In the test chip 200, the metallization layers 272 do not necessarily connect any active devices in the Si device 271 with each other or with external circuitry. To simulate the interconnections of the fully functional chip, in some embodiments, the metallization layers 272 include the same number of dielectric and conductive layers as the metallization layers for a fully functional chip. Each individual layer also has the same thickness. If the metallization layers 272 of the test chip 200 fail a reliability test, the metallization layers of the fully functional chip are likely to fail the test, which prompts a redesign of the fully functional chip.

The dielectric layers in the metallization layers 272 include low-k and/or ELK dielectric materials, un-doped silicate glass (USG), silicon nitride, silicon oxynitride. The low-k dielectric materials, and especially ELK dielectric materials, are more fragile than the other materials and are subject to cracking and/or delamination. The conductive layers in the metallization layers 272 include, in some embodiments, copper or copper alloys.

In some embodiments, a passivation layer is formed on the metallization layers 272 and patterned to form an opening exposing a contact region of the top metallization layer. In one embodiment, the passivation layer is formed of a non-organic material selected from un-doped silicate glass (USG), silicon nitride, silicon oxynitride, silicon oxide, and combinations thereof. In another embodiment, the passivation layer is formed of a polymer layer, such as an epoxy, polyimide, benzocyclobutene (BCB), polybenzoxazole (PBO), and the like. Other relatively soft, often organic, dielectric materials are also usable.

A post passivation interconnect (PPI) line is formed on the passivation layer to define the conductive redistribution layer 273. Using a mask and a photolithography process, a conductive material is filled in the opening of the passivation layer and an opening of the mask, followed by removing the mask and any unwanted exposed conductive portions. The removal includes a wet etching process or a dry etching process. In one embodiment, the removal includes an isotropic wet etching process using an ammonia-based acid, which, in some embodiments, is a flash etching with a short duration.

The conductive redistribution layer 273 includes, but is not limited to copper, aluminum, copper alloy, a nickel-containing layer, other conductive materials, etc. The PPI formation methods include plating, electroless plating, sputtering, chemical vapor deposition methods, and the like. The conductive redistribution layer 273 connects the contact region of the metallization layers 272 to bump features where the contact pads 260 are to be formed.

In some embodiments, a dielectric layer, also referred to as an isolation layer or a second passivation layer, is formed on the exposed passivation layer and the conductive redistribution layer 273. The dielectric layer is formed of dielectric materials such as silicon nitride, silicon carbide, silicon oxynitride or other applicable materials. The formation methods include plasma enhance chemical vapor deposition (PECVD) or other commonly used CVD methods.

In some embodiments, a polymer layer is formed on the dielectric layer. Lithography technology and etching processes such as a dry etch and/or a wet etch process, are then performed to pattern the polymer layer. An opening is thus formed through the polymer layer and the second passivation layer to expose a portion of the conductive redistribution layer 273 for allowing a subsequent bump process. The polymer layer is formed of a polymer, such as an epoxy, polyimide, benzocyclobutene (BCB), polybenzoxazole (PBO), and the like. Other relatively soft, often organic, dielectric materials can also be used. In one embodiment, the polymer layer is a polyimide layer. In another embodiment, the polymer layer is a polybenzoxazole (PBO) layer. The polymer layer has the function of reducing inherent stresses on a corresponding substrate. In addition, the polymer layer is formed to a thickness of tens of microns.

The contact pads 260 are formed in the opening of the polymer layer and the second passivation layer. In some embodiments, the contact pad 260 includes, but is not limited to, aluminum, copper or an aluminum/copper alloy.

An under-bump-metallurgy (UBM) layer that includes, in some embodiments, a diffusion barrier layer and a seed layer, is formed on the contact pads 260. The diffusion barrier layer, also referred to as an adhesion layer, in some embodiments, is formed of tantalum nitride, titanium nitride, tantalum, titanium, or the like. The formation methods include physical vapor deposition (PVD) or sputtering. The seed layer, in some embodiments, is a copper seed layer formed on the diffusion barrier layer. The seed layer, in some other embodiments, is formed of copper alloys that include silver, chromium, nickel, tin, gold, and combinations thereof. In one embodiment, the UBM layer includes a diffusion barrier layer formed of Ti and a seed layer formed of Cu.

A conductive material with solder wettability, such as SnAgCu, or other lead-free or lead-containing solder materials, is deposited on the UBM layer, thereby forming a bump (or solder bump) 275 in contact with the contact pads 260.

At least one test circuit s formed for the test chip 200. The test circuit is a daisy chain that serially connects one of the solder bumps 275 to one or more other solder bumps 275. For example, the test circuit 265 serially connects a solder bump 275A, to a solder bump 275B, and then to a further solder bump 275C. The solder bumps 275A, 275B, 275C in the test circuit 265 are serially connected by the corresponding contact pads 260A, 260B, 260C, the conductive redistribution layer 273, and conductive vias 276 formed between multiple layers of the metallization layers 272. A few, not all, conductive vias 276 are indicated in FIG. 2 for simplicity. The top ends closer to the contact pads 260 of the conductive vias 276 are connected with each other by the conductive redistribution layer 273 and/or by a conductive layer M2, M3 . . . or M7 in the metallization layers 272. The lower ends (i.e., the ends farther from the contact pads 260 than the top ends) of the conductive vias 276 are connected with each other by a conductive layer in the metallization layers 272, for example, by the bottom conductive layer M1 as illustrated in FIG. 2. As a result, the conductive vias 276 are connected by the corresponding conductive layers in the metallization layers 272 and by the conductive redistribution layer 273. Consequently, the test circuit 265 is defined as a continuous chain from one contact pad 260 to another contact pad 260, such as from contact pad 260A to contact pad 260C. The contact pad 260A at the beginning of the chain is connected to a corresponding input terminal of the PCB 243 in a manner described below. The contact pad 260C at the end of the chain is connected to a corresponding output terminal of the PCB 243 in a manner described below.

The test circuit 265 extends through at least two layers of the metallization layers 272. In some embodiments, the test circuit 265 extends through all layers of the metallization layers 272. In one or more embodiments, such a test circuit 265 is formed by including a single conductive via 276 that extends through all dielectric layers of the metallization layers 272, from the top conductive layer to the bottom conductive layer. Alternatively or additionally, the test circuit 265 that extends through all layers of the metallization layers 272 is formed by including several serially connected conductive vias 276 each of which extends through one or more dielectric layers of the metallization layers 272 and which together extend through all dielectric layers of the metallization layers 272. For example, a first conductive via extends through several dielectric layers between the conductive layer M7 and M4, and a second conductive via extends through several dielectric layers between the conductive layer M4 and M1. The first and second conductive vias are serially connected with each other by the conductive layer M4. Each of the first and second conductive vias individually does not extend through all dielectric layers of the metallization layers 272. However, together, the serially connected first and second conductive vias extend through all dielectric layers of the metallization layers 272.

Because the test circuit 265 extends through multiple layers of the metallization layers 272, delamination or cracking in one or more of the low-k or ELK dielectric materials and/or other defects are observable during a reliability test, such as a drop test. Where the test circuit 265 extends through all layers of the metallization layers 272, delamination or cracking in all low-k or ELK dielectric materials and/or other defects are observable during a reliability test, such as a drop test.

In some embodiments, potential delamination or cracking in all low-k or ELK dielectric materials and/or other defects are monitored in a reliability test, such as a drop test, by monitoring a real time change in the resistance of the test circuit 265 during the test. In some embodiments, a real time change in the resistance of the test circuit occurs over a very short period of time such as 0.1-1 µs. The resistance of the test circuit 265 indicates its electrical continuity through multiple layers of the test chip 200. If, due to the mechanical shock load caused by the drop test, the continuity is broken, the resistance of the test circuit 265 momentarily increases, and such a short spike of resistance is registered by the event detector described with respect to FIG. 1. For example, if, due to the mechanical shock load caused by the drop test, an open circuit occurs even for a very short period of 0.1-1 µs, the resistance of the test circuit 265 momentarily increases to above 1000 Ohm, and such a short spike of resistance is registered by the event detector described with respect to FIG. 1. The registered short spike of resistance indicates that the connections, both mechanical and electrical, among the layers of the test circuit 200 fail due to mechanical shock loads.

In some situations, interconnects in a chip are connected together in a single test circuit, and the resistance of a such long chain of interconnects is beyond a range defined by the JEDEC standard. For example, the resistance reaches 20,000 to 30,000 Ohms. To ensure the accuracy of reliability tests, each chip is provided with several test circuits, in some embodiments.

Figure 3A:
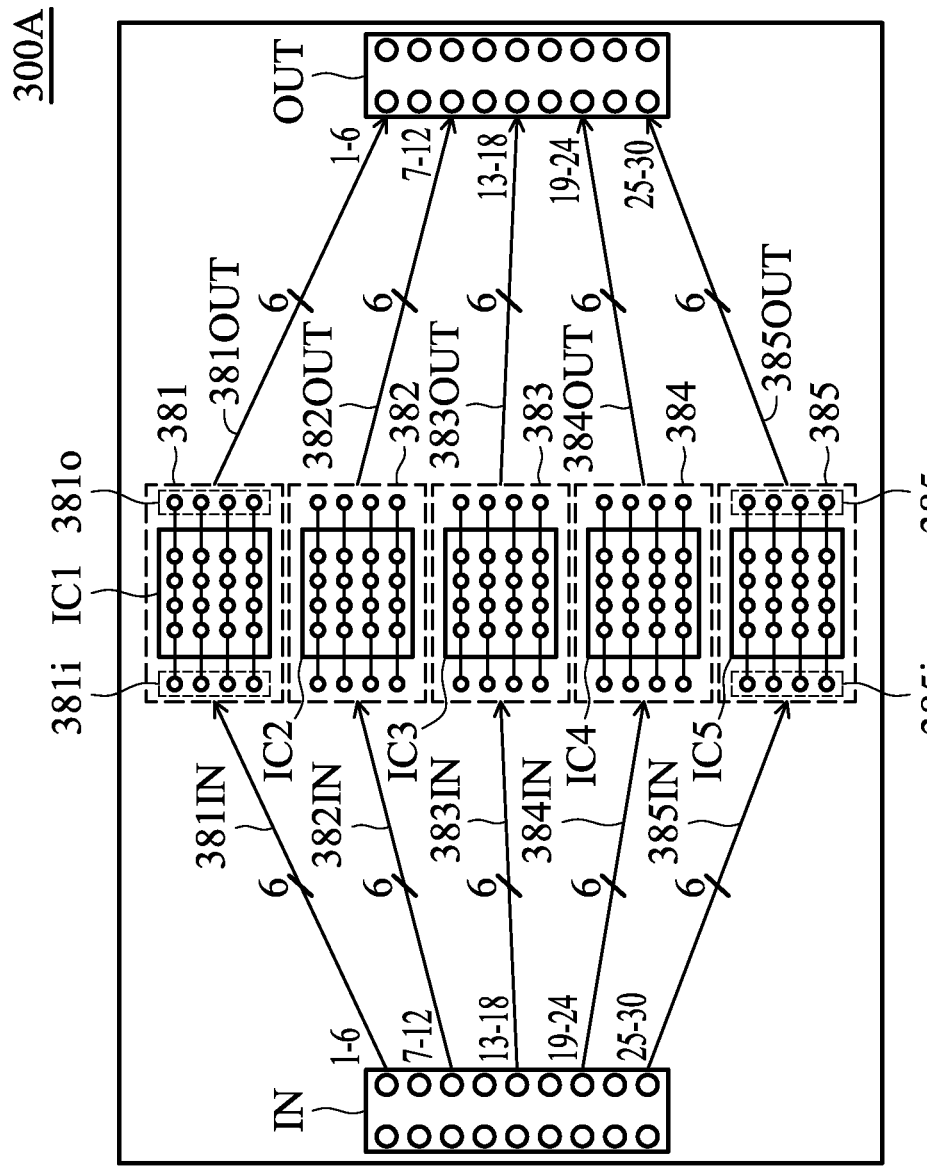
FIGS. 3A-3B, 4A-4B and 5 are schematic block diagrams of various test board configurations in accordance with some embodiments.

FIG. 3A is a schematic diagram of a test board 300A in accordance with some embodiments. The test board 300A includes a PCB which has thereon or therein a plurality of chip mounting areas 381-385 each for mounting therein a test chip IC1-IC5, a plurality of input terminals designated as IN, and a plurality of output terminals designated as OUT. The test board 300A corresponds to the PCB 243 disclosed with respect to FIG. 2, and each test chip IC1-IC5 corresponds to the test chip 200 described with respect to FIG. 2.

The test board 300A further includes a plurality of input conductive patterns each having opposite first and second ends. The first end is connected to one of the input terminals, and the second end is located in a corresponding chip mounting area. For example, in a set of six input conductive patterns designated as 381IN, each input conductive pattern 381IN includes a first end and a second end. The first end is electrically connected to a corresponding one of the input IN pins 1-6. The second end is located in the chip mounting area 381 for the test chip IC1. For illustration, the second ends of the input conductive patterns 381IN are designated as 381i. A similar set-up is also applicable to other sets of each of six input conductive patterns 382IN, 383IN, 384IN, and 385IN. Each input conductive pattern 382IN, 383IN, 384IN, or 385IN includes a first end electrically connected to a corresponding one of the IN pins 7-12, one of the IN pins 13-18, one of the IN pins 19-24, or one of the IN pins 25-30. Each input conductive pattern 382IN, 383IN, 384IN, or 385IN further includes a second end located in the corresponding chip mounting area 382, 383, 384, or 385 for the corresponding test chip IC2, IC3, IC4, or IC5. For illustration, the second ends of the input conductive patterns 385IN are designated as 385i in FIG. 3A.

The test board 300A further includes a plurality of output conductive patterns each having opposite first and second ends. The first end is connected to one of the output terminals, and the second end is located in a corresponding chip mounting area. For example, in a set of six output conductive patterns designated as 381OUT, each output conductive pattern 381OUT includes a first end and a second end. The first end is electrically connected to a corresponding one of the output OUT pins 1-6. The second end is located in the chip mounting area 381 for the test chip IC1. For illustration, the second ends of the output conductive patterns 381OUT are designated as 381o. A similar set-up is also applicable to other sets each of six output conductive patterns 382OUT, 383OUT, 384OUT, and 385OUT. Each output conductive pattern 382OUT, 383OUT, 384OUT, or 385OUT includes a first end electrically connected to a corresponding one of the OUT pins 7-12, one of the OUT pins 13-18, one of the OUT pins 19-24, or one of the OUT pins 25-30. Each output conductive pattern 382OUT, 383OUT, 384OUT, or 385OUT further includes a second end located in the corresponding chip mounting area 382, 383, 384, or 385 for the corresponding test chip IC2, IC3, IC4, or IC5. For illustration, the second ends of the output conductive patterns 385OUT are designated as 385o in FIG. 3A.

Each of the chip mounting areas includes the second ends of multiple input conductive patterns and the second ends of multiple output conductive patterns for connecting multiple test circuits of the corresponding test chip to the corresponding input and output terminals. For example, the chip mounting area 381 includes the second ends 381i of multiple input conductive patterns 381IN, and the second ends 381o of multiple output conductive patterns 381OUT for connecting multiple test circuits of the corresponding test chip IC1 to the corresponding IN pins 1-6 and OUT pins 1-6. For simplicity, the multiple test circuits of the test chips IC1-IC5 are schematically illustrated in FIG. 3A and are not numbered. In the test board 300A, each of the input terminals is electrically connected via the corresponding input conductive pattern to one of the chip mounting areas. Likewise, each of the output terminals is electrically connected via the corresponding output conductive pattern to one of the chip mounting areas. For example, the IN pin 1 is electrically connected via the corresponding input conductive pattern 381IN to the chip mounting area 381, and OUT pin 1 is electrically connected via the corresponding output conductive pattern 381OUT to the chip mounting area 381.

Each test chip IC1-IC5 is configured similarly to the test chip 200 described with respect to FIG. 2. Each test chip includes multiple test circuits. In some embodiments, at least one of the multiple test circuits of the test chip is defined at least by at least two contact pads 260 (FIG. 2) and the conductive redistribution layer 273 (FIG. 2) which is patterned to serially connect the at least two contact pads 260 into a daisy chain. In this manner, the test circuit is at least configured for monitoring the reliability of the upper level of interconnects, i.e., the bumps 275 (FIG. 2), the contact pads 260 and the conductive redistribution layer 273. In some embodiments, at least one of the multiple test circuits of the test chip further extends to the lower level of interconnects, i.e., the metallization layers 272. In this manner, the test circuit is configured, as described with respect to FIG. 2, for also monitoring the reliability of the metallization layers 272, especially the ELK dielectric material layers in the metallization layers 272.

Each test circuit of each test chip has one end connected to the corresponding second end of one input conductive pattern, and an opposite end connected to the corresponding second end of one output conductive pattern. For example, each test circuit of each test chip has one end connected by the bumps 275 to the corresponding second end 381i of the input conductive pattern 381IN, and an opposite end connected to the corresponding second end 381o of the output conductive pattern 381OUT. As a result, each test circuit is connected to the corresponding input and output terminals for further connection to testing equipment, e.g., an event detector. The length and/or the numbers of contact pads and/or layers for each test circuit are selected to meet the requirements of a specific test and/or specific testing equipment. For example, for a drop test using an event detector having a threshold resistance of 1000 Ohm, each test circuit is configured to have an appropriate resistance within the capability of the testing equipment that is not greater than 1000 Ohm, to ensure accurate test results.

In the illustrated embodiment in FIG. 3A, there are six second ends of the input conductive patterns and six second ends of the output conductive patterns in each chip mounting area, corresponding to six input conductive patterns and six output conductive patterns leading into each chip mounting area. However, any number of input and/or output conductive patterns leading to each chip mounting area, as well as any number of chip mounting areas and/or any number of test chips mounted on the test board 300A are implemented in various embodiments. In some embodiments, at least one chip mounting area has more input and/or output conductive patterns leading thereto than at least one other chip mounting area. The physical positions of the chip mounting areas and/or input terminals and/or output terminals are variable as well.

Figure 3B:
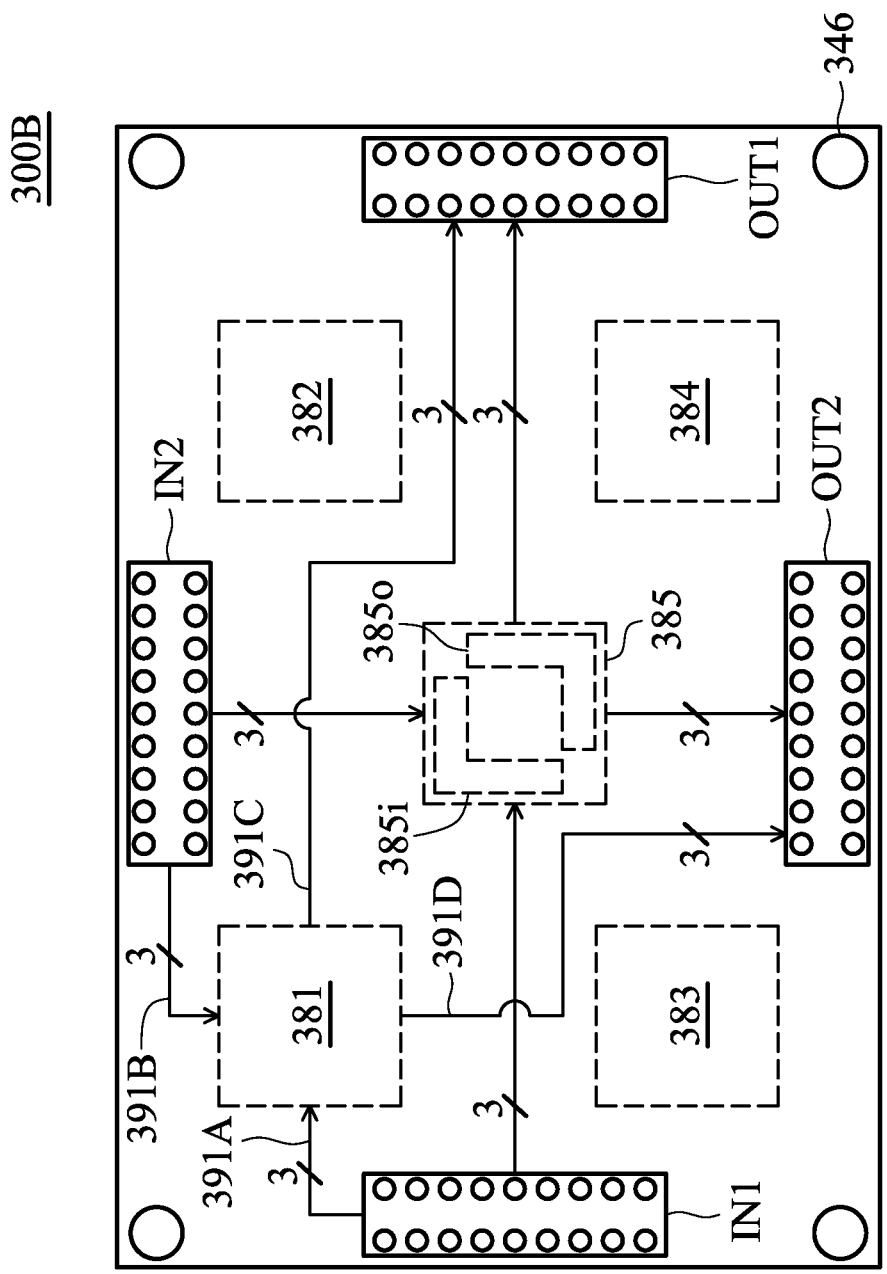

FIG. 3B is a schematic diagram of a test board 300B in accordance with some embodiments. The test board 300B has an electrical arrangement similar to that of the test board 300A. For simplicity, the electrical connections to/from the chip mounting areas 382-384 are omitted in FIG. 3B. The omitted electrical connections are similar to the electrical connections to/from the chip mounting areas 381 and 385 in FIG. 3A.

The test board 300B has, however, a different physical arrangement from the test board 300A. For example, the input terminals of the test board 300B are grouped into two input areas IN1, and IN2. Likewise, the output terminals of the test board 300B are grouped into two output areas OUT1, and OUT2. Each of the input areas IN1 and IN2 has a corresponding set of three input conductive patterns, designated as 391A and 391B, leading to each chip mounting area 381. The input conductive patterns 391A and 391B together perform the function of the input conductive pattern 381IN of the test board 300A. Likewise, each of the output areas OUT1 and OUT2 has a corresponding set of three output conductive patterns, designated as 391C and 391D, leading to each chip mounting area 381. The output conductive patterns 391C and 391D together perform the function of the output conductive pattern 381OUT of the test board 300A. The chip mounting areas 381-385 are distributed at different physical locations on the test board 300B to determine the location that is most or least likely to fail to be made with a minimal number of tests. The test board 300B further includes mounting fixtures, e.g., holes 346, for fixing the test board 300B to testing equipment, e.g., a drop table. For simplicity, one hole 346 is labeled.

The test board 300B is in a state with no chip mounted in the corresponding chip mounting areas 381-385. The test board 300B, in some embodiments, is provided as a universal test board which gives the user the flexibility of selecting a desired test chip to be mounted on the test board 300B. In some embodiments, identical test chips are mounted in some or all chip mounting areas 381-385 for simultaneously testing the multiple test chips. In further embodiments, different test chips are mounted in different chip mounting areas 381-385. In one or more embodiments, one or more chip mounting areas is/are left empty without a test chip mounted thereon.

Figure 4A:
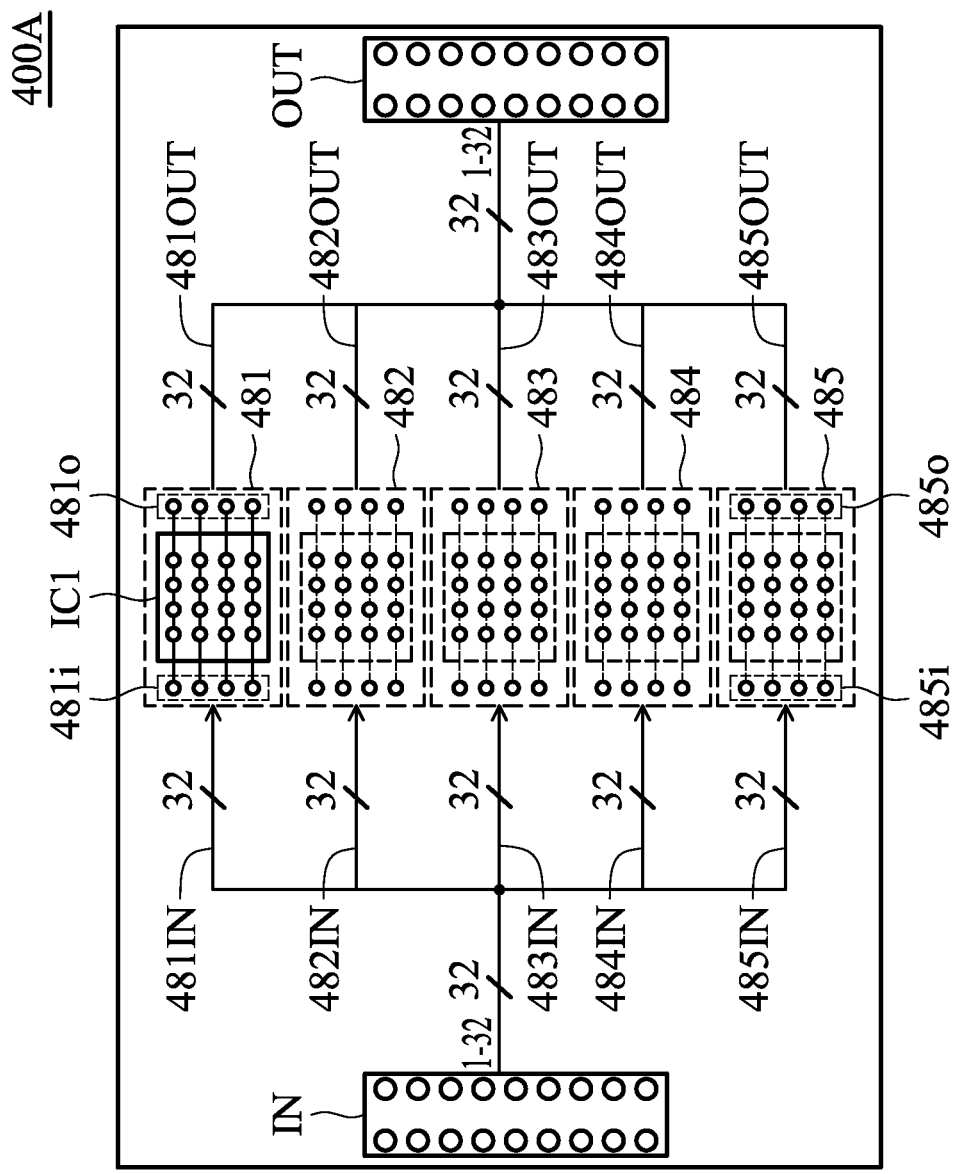

FIG. 4A is a schematic diagram of a test board 400A in accordance with some embodiments. The test board 400A includes a PCB which has thereon or therein a plurality of chip mounting areas 481-385, a plurality of input terminals designated as IN and a plurality of output terminals designated as OUT. Each mounting area 481-485 is for mounting therein a test chip. For simplicity, only IC1 is indicated in the chip mounting area 481. The test board 400A corresponds to the PCB 243 disclosed with respect to FIG. 2, and the test chip IC1 corresponds to the test chip 200 described with respect to FIG. 2.

At least one of the input terminals is connected to multiple chip mounting areas. Likewise, at least one of the output terminals is connected to multiple chip mounting areas. For example, each of the input terminals IN pins 1-32 and the output terminals OUT pins 1-32 is connected to all chip mounting areas 481-485.

In some embodiments, each input conductive pattern includes a first end electrically connected to a corresponding one of the input terminals IN, and a second end located in the corresponding chip mounting area. For example, in a set of 32 input conductive patterns, designated as 481IN, each input conductive pattern 481IN includes a first end electrically connected to a corresponding one of IN pins 1-32, and a second end located in the chip mounting area 481 for the test chip IC1. The second ends of the input conductive patterns 481IN are designated as 481i. A similar set-up is also applicable to other sets each of 32 input conductive patterns 482IN, 483IN, 484IN, and 485IN. Each input conductive pattern 482IN, 483IN, 484IN, or 485IN includes a first end electrically connected to a corresponding one of IN pins 1-32. Each input conductive pattern 482IN, 483IN, 484IN, or 485IN further includes a second end located in the corresponding chip mounting area 482, 483, 484, or 485. For illustration, the second ends of the input conductive patterns 485IN are designated, as 485i, in FIG. 4A.

In some embodiments, each output conductive pattern includes a first end electrically connected to a corresponding one of the output terminals OUT, and a second end located in the corresponding chip mounting area. For example, in a set of 32 output conductive patterns, designated as 481OUT, each output conductive pattern 481OUT includes a first end electrically connected to a corresponding one of OUT pins 1-32, and a second end located in the chip mounting area 481 for the test chip IC1. The second ends of the output conductive patterns 481OUT are designated as 481o. A similar set-up is also applicable to other sets each of 32 output conductive patterns 482OUT, 483OUT, 484OUT, and 485OUT. Each output conductive pattern 482OUT, 483OUT, 484OUT, or 485OUT includes a first end electrically connected to a corresponding one of OUT pins 1-32. Each output conductive pattern 482OUT, 483OUT, 484OUT, or 485OUT further includes a second end located in the corresponding chip mounting area 482, 483, 484, or 485. For simplicity, the second ends of the output conductive patterns 485OUT are designated, as 485o, in FIG. 4A.

Figure 4B:
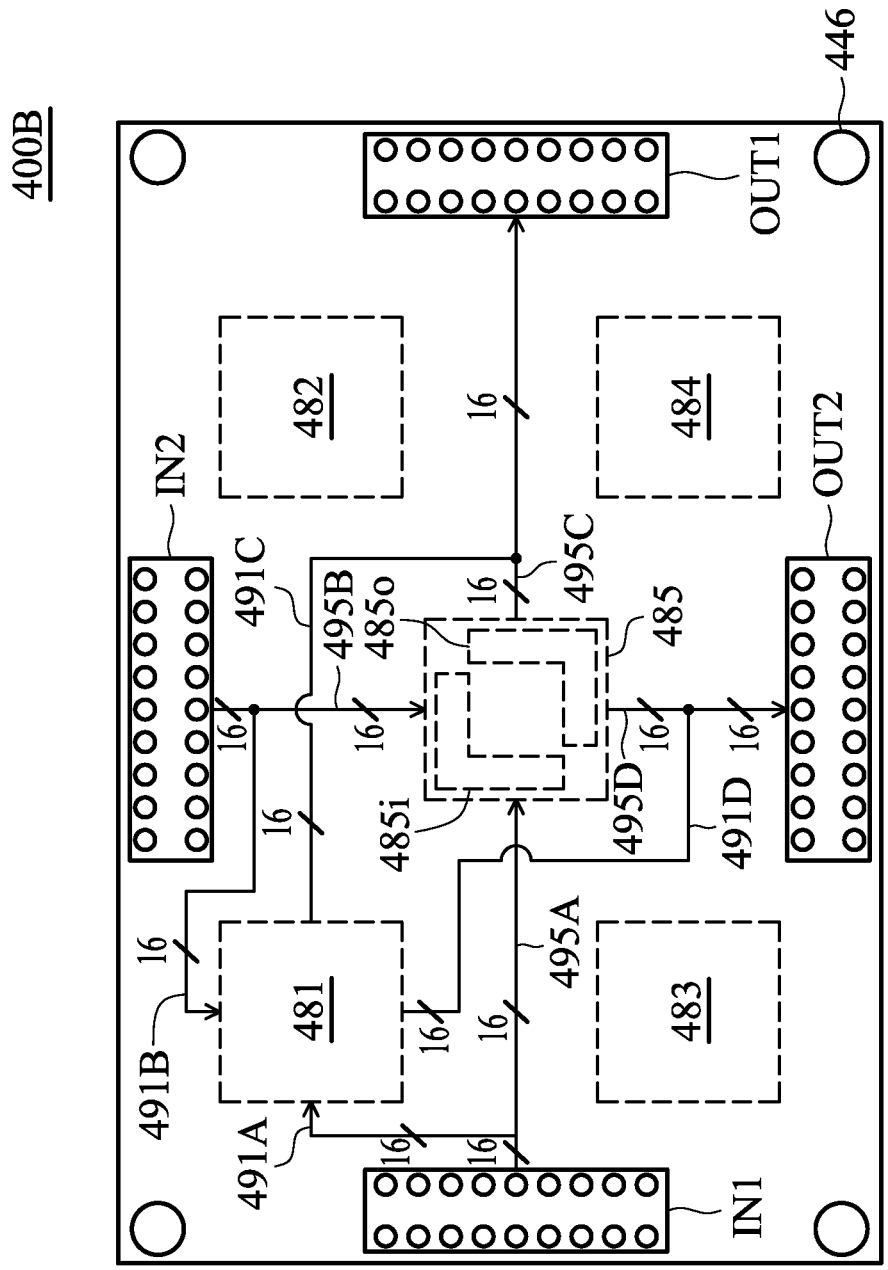

In some embodiments, each of the chip mounting areas includes the second ends of multiple input conductive patterns, and the second ends of multiple output conductive patterns for connecting multiple test circuits of the corresponding test chip to the corresponding input and output terminals. For example, the chip mounting area 481 includes the second ends 481i of multiple input conductive patterns 481IN, and the second ends 481o of multiple output conductive patterns 481OUT, for connecting multiple test circuits of the corresponding test chip IC1 to the corresponding IN pins 1-32 and OUT pins 1-32. For simplicity, the multiple test circuits of the test chip IC1 are schematically illustrated in FIG. 4B and are not numbered.

The test chip IC1 is configured similarly to the test chip 200 described with respect to FIG. 2 and as described with respect to FIG. 3A. The test board 400A is illustrated as including one test chip, i.e., the test chip IC1, mounted in the corresponding chip mounting area 481 thereof. The other chip mounting areas 482-485 are left empty, as illustrated by the dot-dot lines inside each of the chip mounting areas 482-485 in FIG. 4A.

In some embodiments, the test chip IC1 has a sufficient number of test circuits to use all available input and output terminals of the test board 400A. For example, where the test board 400A provides 32 available pairs of input and output terminals and the test chip IC1 has 32 or more test circuits, up to 32 available pairs of input and output terminals provided by the test board 400A are usable to test up to 32 test circuits of the test chip IC1. In this case, one test chip, i.e., IC1, is mounted on the test board 400A and tested at a time. To test chip reliability at different physical locations of the other chip mounting areas 482-485, multiple tests are performed, again with one test chip at a time.

In some embodiments, not all available input and output terminals of the test board 400A are used for testing the test chip IC1, e.g., due to an insufficient number of test circuits in the test chip IC1 and/or due to test requirements. For example, where the test board 400A provides 32 available pairs of input and output terminals and 17 test circuits are provided (or to be tested) in the test chip IC1, up to 17 available pairs of input and output terminals provided by the test board 400A are usable to test up to 17 test circuits of the test chip IC1. If all 17 test circuits are to be tested, one test chip, i.e., IC1, is mounted on the test board 400A and tested at a time. To test chip reliability at different physical locations of the other chip mounting areas 482-485, multiple tests are performed, again with one test chip at a time.

In some embodiments, two or more test chips are tested at a time. For example, where the test board 400A provides 32 available pairs of input and output terminals and 16 test circuits are provided (or to be tested) in each test chip, up to 32 available pairs of input and output terminals provided by the test board 400A are usable to test two test chips at a time. For example, one test chip is mounted in the chip mounting area 481 and is connected to one set of input and output terminals, e.g., IN pins 1-16 and OUT pins 1-16 for testing, whereas the other chip is mounted in another chip mounting area, e.g., 482, and is connected to a different set of input and output terminals, e.g., IN pins 17-32 and OUT pins 17-32 for testing. In one or more embodiment, one test chip is connected to more input and output terminals than the other. In one or more embodiment, more than two test chips are tested at the same time, provided that the test chips are connected to different sets of input and output terminals.

Another number of input and output terminals and/or another number of chip mounting areas and/or another number of test chips mounted on the test board 400A are implemented in various embodiments. The physical positions of the chip mounting areas and/or input terminals and/or output terminals are variable as well.

FIG. 4B is a schematic diagram of a test board 400B in accordance with some embodiments. The test board 400B has an electrical arrangement similar to that of the test board 400A (FIG. 4A). For simplicity, the electrical connections to/from the chip mounting areas 482-484 are omitted in FIG. 4B. The omitted electrical connections are similar to the electrical connections to/from the chip mounting areas 481 and 485.

The test board 400B has, however, a different physical arrangement from the test board 400A. For example, the input terminals of the test board 400B are grouped into two input areas IN1, and IN2. Likewise, the output terminals of the test board 400B are grouped into two output areas OUT1, and OUT2. Each of the input areas IN1, IN2 has a corresponding set of 16 input conductive patterns, designated as 491A, 491B (or 495A, 495B), leading to each chip mounting area, e.g., 481 (or 485). The input conductive patterns 491A, 491B (or 495A, 495B) together perform the function of the input conductive pattern 481IN (or 485IN) of the test board 400A. Likewise, each of the output areas OUT1, OUT2 has a corresponding set of 16 output conductive patterns, designated as 491C, 491D (or 495C, 495D), leading to each chip mounting area, e.g., 481 (or 485). The output conductive patterns 491C, 491D (or 495C, 495D) together perform the function of the output conductive pattern 481OUT (or 485OUT) of the test board 400A. The input conductive patterns, e.g., 491A, 495A, outgoing from the same input area, e.g., IN1, are connected to the input terminals in the input area IN1. Likewise, the output conductive patterns, e.g., 491D, 495D, coming into the same output area, e.g., OUT2, are connected to the output terminals in the output area OUT2.

The chip mounting areas 481-485 are distributed at different physical locations on the test board 400B to permit a determination of the location that is most or least likely to fail to be made with a minimal number of tests. The test board 400B further includes mounting fixtures, e.g., holes 446, for fixing the test board 400B to testing equipment, e.g., a drop table. For simplicity, one hole 446 is labeled.

The test board 400B is in a state with no chip mounted in the chip mounting areas 481-485. The test board 400B is, in some embodiments, provided as a universal test board which gives the user the flexibility of selecting a desired test chip to be mounted on a desired location (i.e., chip mounting area) of the test board 400B.

Figure 5:
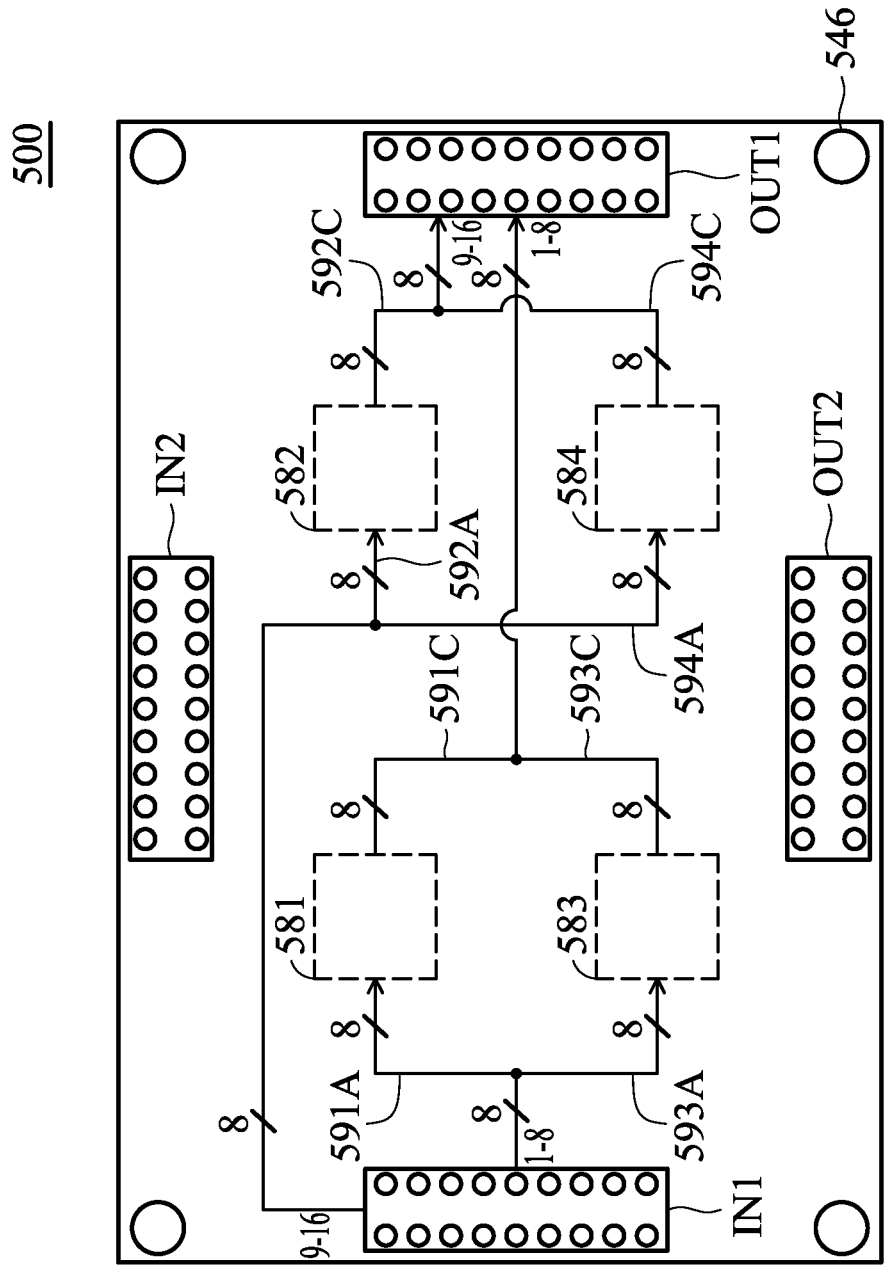

FIG. 5 is a schematic diagram of a test board 500 in accordance with some embodiments. For simplicity, the individual electrical connections to/from the input and output areas IN2 and OUT2 are omitted in FIG. 5. The omitted electrical connections are similar to the electrical connections to/from the input and output areas IN1 and OUT1.

The input terminals in the input area IN1 include a first set (e.g., IN pins 1-8) and a second set (e.g., IN pins 9-16) of input terminals. The output terminals in the output area OUT1 include a first set (e.g., OUT pins 1-8) and a second set (e.g., OUT pins 9-16) of output terminals. The chip mounting areas 581-584 include a first group 581 and 583 and a second group 582 and 584 of chip mounting areas. The input terminals in the first set (e.g., IN pins 1-8) are connected to the chip mounting areas 581 and 583 in the first group, by way of corresponding input conductive patterns 591A and 593A. The output terminals in the first set (e.g., OUT pins 1-8) are connected to the chip mounting areas 581 and 583 in the first group, by way of corresponding output conductive patterns 591C and 593C. The input terminals in the second set (e.g., IN pins 9-16) are connected to the chip mounting areas 582 and 584 in the second group, by way of corresponding input conductive patterns 592A and, 594A. The output terminals in the second set (e.g., OUT pins 9-16) are connected to the chip mounting areas 582 and 584 in the second group, by way of corresponding output conductive patterns 592C and 594C.

In some embodiments, the chip mounting areas in the same group are connected to the same set of input and output terminals. For example, the chip mounting areas 581 and 583 in the same first group are connected to the same set of input and output terminals IN pints 1-8 and OUT pins 1-8. Further, for each group of chip mounting areas on the test board 500, one test chip is mounted at a time in a chip mounting area in the group for testing. In contrast, a different test is performed to test a test chip mounted on a different chip mounting area in the group. For example, for the first group of chip mounting area, one test chip is mounted in the chip mounting area 581, and, a different test is performed to test a different test chip mounted on the chip mounting area 583.

In some embodiments, the chip mounting areas in different groups are separately connected to different sets of input and output terminals. For example, the chip mounting area 581 from the first group and the chip mounting area 582 from the second group are separately connected to different sets of input and output terminals. Specifically, the chip mounting area 581 from the first group is connected to the IN pins 1-8 and OUT pins 1-8, where as the chip mounting area 582 from the second group is connected to the IN pins 9-16 and OUT pins 9-16. Further, multiple test chips are mounted in chip mounting areas of different groups to be tested at the same time (i.e., in the same test). For example, a first test chip is mounted in the chip mounting area 581 of the first group and a second test chip is mounted in the chip mounting area 582 of the second group. The first and second test chips are tested together in the same test.

The chip mounting areas 581-584 are distributed at different physical locations on the test board 500 to determine the location that is most/least likely to fail to be made with a minimal number of tests. The test board 500 further includes mounting fixtures, e.g., holes 546, for fixing the test board 500 to testing equipment, e.g., a drop table. For simplicity, one hole 546 is labeled. The test board 500 is in a state with no chip mounted in the chip mounting areas 581-584. The test board 500 is, in some embodiments, provided as a universal test board which gives the user the flexibility of selecting a desired test chip to be mounted on a desired chip mounting area of the test board 500. Any number of sets of input and output terminals and/or any number of input or output terminals in each set and/or any number of groups of chip mounting areas and/or any number of chip mounting areas in each group and/or any number of test chips mounted on the test board 500 are implemented in various embodiments.

Figure 6:
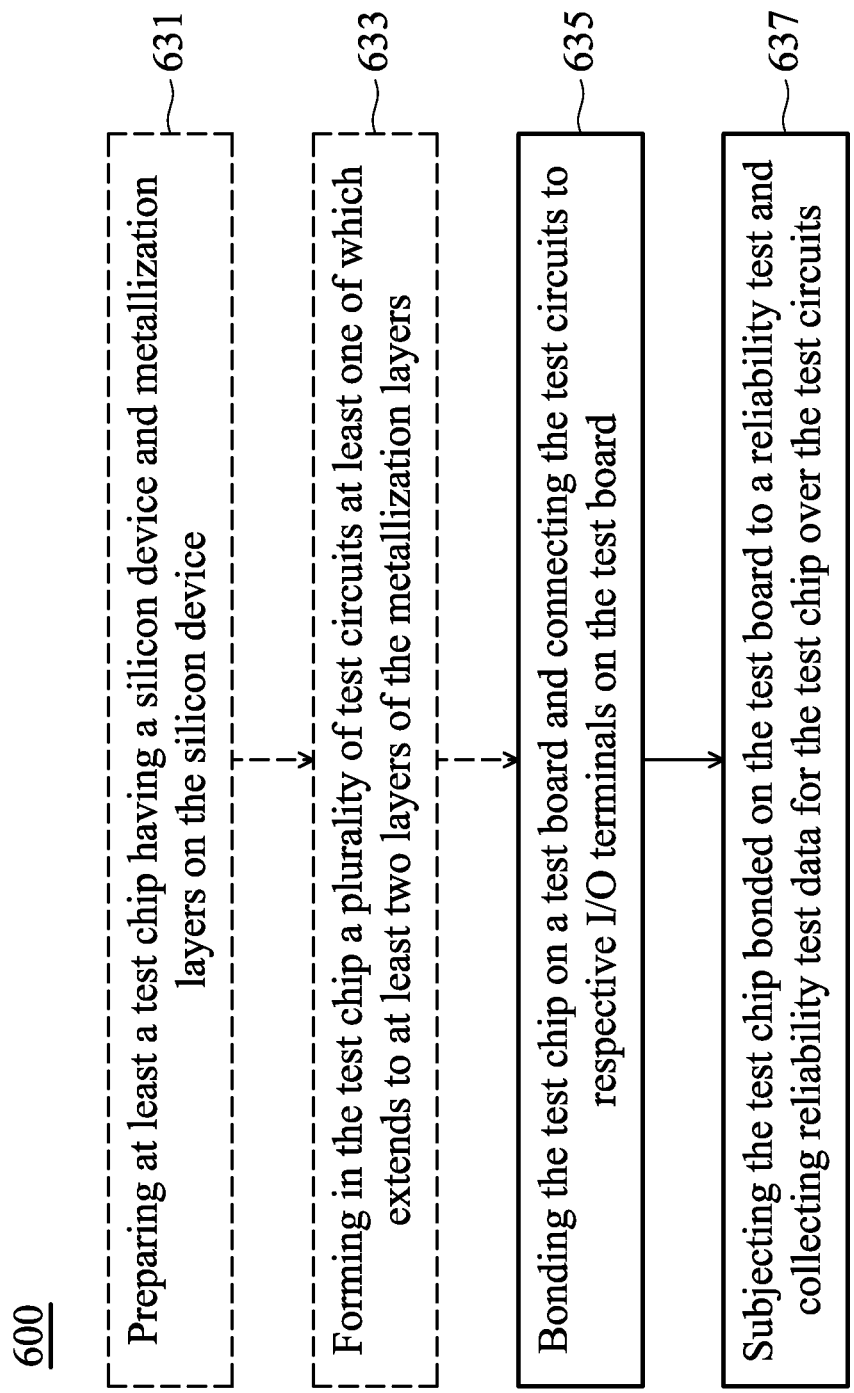
FIG. 6 is a flow chart of a method in accordance with some embodiments.

FIG. 6 is a flow chart of a method 600 in accordance with some embodiments. At step 631, a test chip is prepared having at least a Si device and metallization layers over the Si device. For example, metallization layers 272 in FIG. 2 are over Si device 271.

At step 633, a plurality of test circuits are formed in the test chip. At least one of the test circuits extends through at least two layers of the metallization layers, e.g., as described with respect to FIG. 2.

At step 635, the test chip is bonded on the test board, e.g., by bumps 275 (FIG. 2). The multiple test circuits of the test chip are connected to input and output terminals on the test board, e.g., by way of multiple input and output conductive patterns as described with respect to FIGS. 3A-3B, 4A-4B and 5.

At step 637, the bonded test chip and the test board are subjected to a reliability test, e.g., a drop test as described with respect to FIG. 1. Other reliability tests for checking reliability of a chip are implemented in accordance with one or more embodiments. Such other tests include, but are not limited to, temperature cycling tests, vibration tests, and humidity cycling tests. In some embodiments, reliability tests designed for the ICs in other applications and/or industries, including devices other than handheld devices, are performed at step 637.

The above method embodiment shows exemplary steps, but the steps are not necessarily required to be performed in the order shown. Steps may be added, replaced, changed order, and/or eliminated as appropriate, in accordance with the spirit and scope of embodiments of the disclosure. For example, in some embodiments, one or more of steps 631, 633 is/are omitted.

Embodiments that combine different features and/or different embodiments are within scope of the disclosure and will be apparent to those of ordinary skill in the art after reviewing this disclosure.

According to some embodiments, a test chip comprises a silicon device, a plurality of dielectric and conductive layers arranged alternately on the silicon device, a conductive substrate or redistribution layer formed on the plurality of dielectric and conductive layers, a plurality of contact pads formed on the conductive substrate or redistribution layer, and at least one conductive via extending through multiple layers among the plurality of dielectric and conductive layers. The conductive substrate or redistribution layer, at least two of the contact pads and the at least one conductive via are serially connected to define a test circuit which extends through multiple layers among the plurality of dielectric and conductive layers.

According to some embodiments, a test board comprises a printed circuit board (PCB) having a plurality of chip mounting areas each for mounting therein a test chip, a plurality of input and output terminals, and a plurality of input and output conductive patterns. Each input conductive pattern has a first and a second ends, the first end of each of the input conductive patterns being connected to one of the input terminals. Each output conductive pattern has a first and a second ends, the first end of each of the output conductive patterns being connected to one of the output terminals. Each of the chip mounting areas includes the second end of each of multiple input conductive patterns and the second end of each of multiple output conductive patterns for connecting multiple test circuits of the corresponding test chip to the corresponding input and output terminals.

According to some embodiments, a chip reliability testing method comprises mounting at least a test chip on a test board, and subjecting the test chip mounted on the test board to a reliability test. The test chip includes a plurality of test circuits each being a daisy chain continuously extending from one contact pad of the test chip to another contact pad of the test chip via at least a conductive substrate or redistribution layer of the test chip. The mounting includes connecting each test circuit to a different pair of input and output terminals on the test board.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A test chip, comprising:
   a silicon device;
   a plurality of dielectric and conductive layers arranged alternately over the silicon device;
   a conductive substrate or redistribution layer over the plurality of dielectric and conductive layers;
   a plurality of contact pads over the conductive substrate or redistribution layer;
   a plurality of bumps over the plurality of contact pads; and
   a plurality of conductive vias among the plurality of dielectric and conductive layers, wherein the plurality of conductive vias are spaced from the silicon device by at least one of the plurality of dielectric layers;
   wherein the conductive substrate or redistribution layer, the plurality of contact pads, and the plurality of conductive vias are configured as at least a first test circuit electrically connecting a first bump of the plurality of bumps with a second bump of the plurality of bumps through the plurality of dielectric and conductive layers.

2. The test chip of claim 1, further comprising:
   a second test circuit electrically connecting the second bump of the plurality of bumps with a third bump of the plurality of bumps through the plurality of dielectric and conductive layers, the first test circuit and the second test circuit are electrically connected together at the conductive substrate or redistribution layer.

3. The test chip of claim 1, wherein the dielectric layers include extra low-k (ELK) dielectric materials.

4. The test chip of claim 1, wherein the silicon device is free of active devices.

5. The test chip of claim 1, wherein the each of the plurality of dielectric and conductive layers arranged alternately over the silicon device has a same thickness.

6. The test chip of claim 1, wherein the conductive layers include copper or copper alloys.

7. A test board, comprising:
   a printed circuit board (PCB) having
      a plurality of chip mounting areas each for mounting therein a test chip;
      a plurality of input terminals grouped in an input area of the PCB;
      a plurality of output terminals grouped in an output area of the PCB;
      a plurality of input conductive patterns; and
      a plurality of output conductive patterns,
   wherein each of the chip mounting areas is electrically coupled with a sub-set of the plurality of input terminals through a sub-set of the plurality of input conductive patterns and is electrically coupled with a sub-set of the plurality of output terminals through a sub-set of the plurality of output conductive patterns;
   at least one test chip mounted in one of the chip mounting areas, the at least one test chip comprising
      a silicon device;
      a plurality of dielectric and conductive layers arranged alternately over the silicon device;
      a conductive substrate or redistribution layer formed over the plurality of dielectric and conductive layers; and
      a plurality of contact pads formed over the conductive substrate or redistribution layer, wherein
         each test circuit of a plurality of test circuits of the at least one test chip is defined at least partially by at least two of the contact pads;
         the conductive substrate or redistribution layer connects the at least two contact pads; and
         each test circuit of the plurality of test circuits is electrically coupled with at least one of the input conductive patterns and at least one of the output conductive patterns.

8. The test board of claim 7, wherein the at least one test chip further comprises:
   at least a conductive via among the plurality of dielectric and conductive layers;
   wherein the conductive substrate or redistribution layer, at least two of the contact pads and the conductive via are serially connected together to define one of the test circuits which extends through the multiple layers among the plurality of dielectric and conductive layers and is electrically connected to the corresponding input and output terminals by way of the corresponding input and output conductive patterns on the PCB.

9. The test board of claim 7, wherein the at least one test chip further comprises:
   multiple conductive vias among multiple layers of the plurality of dielectric and conductive layers and defines a part of one of the test circuits.

10. The test board of claim 7, further comprising multiple test chips each mounted in one of the chip mounting areas.

11. The test board of claim 7, wherein
at least one of the plurality of input terminals is electrically connected to two or more of the plurality of chip mounting areas; and
at least one of the plurality of output terminals is electrically connected to the two or more of the plurality of chip mounting areas.

12. The test board of claim 7, wherein
at least one of the plurality of input terminals is electrically connected to all of the plurality of chip mounting areas; and
at least one of the plurality of output terminals is electrically connected to all of the plurality of chip mounting areas.

13. The test board of claim 12, further comprising one the test chip mounted in one of the chip mounting areas, wherein the remaining chip mounting areas are empty without another test chip mounted therein.

14. The test board of claim 7, wherein
the chip mounting areas include at least a first group of chip mounting areas and a second group of chip mounting areas;
the first group of chip mounting areas is electrically coupled with a first sub-set of the plurality of input terminals;
the second group of chip mounting areas is electrically coupled with a second sub-set of the plurality of input terminals, the first sub-set of the plurality of input terminals and the second sub-set of the plurality of input terminals being different;
the first group of chip mounting areas is electrically coupled with a first sub-set of the plurality of output terminals; and
the second group of chip mounting areas is electrically coupled with a second sub-set of the plurality of output terminals, the first sub-set of the plurality of output terminals and the second sub-set of the plurality of output terminals being different.

15. The test board of claim 7, wherein
the input area is at a first periphery of the PCB; and
the output area at a second periphery of the PCB.

16. A test board, comprising:
a first chip mounting area configured for mounting therein a first chip;
a first plurality of input pins at a first periphery of the test board;
a second plurality of input pins at a second periphery of the test board;
a first plurality of output pins at a third periphery of the test board;
a second plurality of output pins at a fourth periphery of the test board;
a first conductive pattern electrically connecting a first input pin of the first plurality of input pins and a first pin of the first chip mounting area;
a second conductive pattern electrically connecting a first input pin of the second plurality of input pins and a second pin of the first chip mounting area;
a third conductive pattern electrically connecting a first output pin of the first plurality of output pins and a third pin of the first chip mounting area;
a fourth conductive pattern electrically connecting a first output pin of the second plurality of output pins and a fourth pin of the first chip mounting area;
a fifth conductive pattern electrically connecting a second input pin of the first plurality of input pins and a fifth pin of the first chip mounting area; and
a sixth conductive pattern electrically connecting a second output pin of the first plurality of output pins and a sixth pin of the first chip mounting area.

17. The test board of claim 16, further comprising:
a second chip mounting area configured for mounting therein a second chip;
a seventh conductive pattern electrically connecting a third input pin of the first plurality of input pins and a first pin of the second chip mounting area;
an eighth conductive pattern electrically connecting a second input pin of the second plurality of input pins and a second pin of the second chip mounting area;
a ninth conductive pattern electrically connecting a third output pin of the first plurality of output pins and a third pin of the second chip mounting area; and
a tenth conductive pattern electrically connecting a second output pin of the second plurality of output pins and a fourth pin of the second chip mounting area.

18. The test board of claim 16, further comprising:
the first chip mounted in the first chip mounting area, the first chip comprising:
a first conductive path configured to electrically connect the first pin of the of the first chip mounting area and the third pin of the first chip mounting area; and
a second conductive path configured to electrically connect the second pin of the of the first chip mounting area and the fourth pin of the first chip mounting area.

19. The test board of claim 16, further comprising:
a seventh conductive pattern electrically connecting a second input pin of the second plurality of input pins and a seventh pin of the first chip mounting area; and
an eighth conductive pattern electrically connecting a second output pin of the second plurality of output pins and an eighth pin of the first chip mounting area.

20. The test board of claim 16, further comprising:
a second chip mounting area configured for mounting therein a second chip;
a seventh conductive pattern electrically connecting the first input pin of the first plurality of input pins and a first pin of the second chip mounting area;
an eighth conductive pattern electrically connecting the first input pin of the second plurality of input pins and a second pin of the second chip mounting area;
a ninth conductive pattern electrically connecting the first output pin of the first plurality of output pins and a third pin of the second chip mounting area; and
a tenth conductive pattern electrically connecting the first output pin of the second plurality of output pins and a fourth pin of the second chip mounting area.

* * * * *